United States Patent [19]

St. Clair et al.

[11] 4,284,461
[45] Aug. 18, 1981

[54] ALUMINUM ION-CONTAINING POLYIMIDE ADHESIVES

[76] Inventors: Robert A. Frosch, Administrator of the National Aeronautics and Space Administration, with respect to an invention of Anne K. St. Clair, Poquoson; Larry T. Taylor, Blacksburg; Terry L. St. Clair, Poquoson, all of Va.

[21] Appl. No.: 92,142

[22] Filed: Nov. 7, 1979

[51] Int. Cl.$^3$ ............................................. C08G 69/28
[52] U.S. Cl. ............................ 156/331.5; 156/307.3; 156/307.5; 156/307.7; 528/172; 528/173; 528/180; 528/20 7; 528/208; 528/210; 528/211; 528/225; 528/228; 528/351; 528/353; 528/126
[58] Field of Search ................. 156/331, 307.3, 307.5, 156/307.7; 528/180, 172, 173, 207, 208, 126, 210, 211, 225, 228, 351, 353

[56] References Cited

U.S. PATENT DOCUMENTS

| | | | |
|---|---|---|---|
| 3,108,091 | 10/1963 | Illing et al. | 260/45.75 |
| 3,407,169 | 10/1968 | Johnson et al. | 260/38 |
| 3,410,826 | 11/1968 | Endrey | 528/353 X |
| 3,458,474 | 7/1969 | Wilhelm et al. | 260/45.75 |
| 3,740,366 | 6/1973 | Sanderson et al. | 260/29.6 |
| 3,996,203 | 12/1976 | Hand et al. | 528/336 |
| 4,063,984 | 12/1977 | Critchley | 156/331 X |
| 4,065,345 | 12/1977 | Progar et al. | 156/331 X |

*Primary Examiner*—Howard E. Schain
*Attorney, Agent, or Firm*—Howard J. Osborn; John R. Manning; Wallace J. Nelson

[57] ABSTRACT

A method for preparing an aluminum ion-filled polyimide adhesive wherein a meta-oriented aromatic diamine is reacted with an aromatic dianhydride and an aluminum compound in the presence of a water or lower alkanol miscible ether solvent to produce an intermediate polyamic acid; and thereafter converting the polyamic acid to the thermally stable, metal ion-filled polyimide by heating in the temperature range of 300° C. to produce a flexible, high temperature adhesive.

6 Claims, No Drawings

ALUMINUM ION-CONTAINING POLYIMIDE ADHESIVES

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; USC 2457).

BACKGROUND OF THE INVENTION

Adhesive bonding is a well known method for joining similar and dissimilar materials. However, the advent of both metallic and nonmetallic materials which are capable of withstanding high temperatures has generated a need for high-temperature stable adhesives for bonding advanced materials. The increased use of titanium and thermally resistant composites and films for aerospace applications has led to the investigation of polyimides as base ingredients for adhesive formulations. Due to their excellent thermal stability, the linear polyimides should make good candidates. The room temperature adhesive strengths of linear polyimides are high, but unfortunately the normal thermoplastic nature of those polymers most suitable as polyimide ahesives prevents them from exhibiting good adhesive strengths at temperatures in the range of 250°-350° C. on such metals as steel or titanium. Modifications to improve the adhesive properties of linear polyimides have generally been made at a sacrifice to the long term thermal stability of the resins.

Two modifications which have made considerable improvements in the overall adhesive properties of linear polyimides are: (1) the preparation of the polymers from isomeric metaoriented aromatic diamines, and (2) the preparation of the polymers in certain water- or alcohol-miscible ether solvents. The addition of large amounts of aluminum (Al) powder to the resins prior to bonding is another modification that has served to improve the adhesive strengths of polyimides at high temperatures. The Al powder acts as a filler to increase the softening temperature of the polymer and also acts as a buffer to aid the polymer in matching more closely the thermal coefficient of expansion of the metal adherend.

Although high temperature strengths are improved, the addition of metal fillers to polyimides produces certain disadvantages. One drawback is the drastic increase in weight caused by the added metal which, in effect, defeats the use of a polymeric adhesive on aircraft or spacecraft for the purpose of weight-savings. Also, polyimide adhesives tend to weaken with the addition of metal fillers due to a loss in flexibility of the adhesive joint. The added metal embrittles the fully cured polymer, thus sacrificing toughness. Thus, there is a definite need in the art for an improved high temperature strength adhesive for use in aerospace applications.

It is therefore an object of the present invention to provide an improved lightweight, adhesive for joining structures adapted for exposure to high temperatures.

Another object of the present invention is a method of preparing a high temperature stable polyimide adhesive.

A further object of the present invention is a method of making an aluminum ion-containing polyimide for use as an adhesive to join metallic structures.

BRIEF DESCRIPTION OF THE INVENTION

According to the present invention, the foregoing and additional objects are attained by providing an improved aluminum "ion"-containing polyimide adhesive which retains flexibility in the fully cured state and which has excellent bonding characteristics at high temperatures without the addition of heavy metal fillers.

The process for producing an aluminum ion-containing polyimide adhesive according to the present invention involves the following steps: (1) preparation of the polyamic acid in a solvent or mixture of solvents, one of which is a water- or alcohol-miscible ether; (2) addition of aluminum ions in the form of "Al(acac)$_3$", tris-(acetylacetonato)aluminum (III). (3) application of the Al/polyamic acid solution to a substrate prepared for bonding; and, (4) conversion of the Al/polyamic acid to the aluminum ion-containing polyimide by heating in the range of 250°-350° C. and, if necessary, applying pressure.

Preparation of the aluminum ion-containing polyamic acid involves the addition of an equimolar quantity of 3,3',4,4'-benzophenone tetracarboxylic acid dianhydride (BTDA) to a stirred solution of 3,3'-diaminobenzophenone (3,3'-DABP) in a water- or alcohol-miscible ether solvent or mixture of solvents, one of which is an ether. The Al(acac)$_3$ complex is then added to the above solution at the concentration of 2-3 percent by weight. The reaction is carried out at room temperature, and the resulting Al/polyamic acid which forms after several hours is a viscous, smooth polymeric solution with an inherent viscosity of at least 0.4 dl/g when measured at 0.5 percent solids in an amide solvent at 35° C.

The polyamic acid is characterized by a recurring unit with the following structural formula:

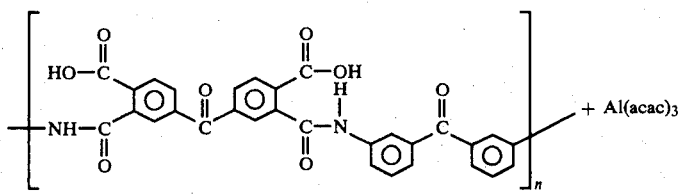

n = number of repeat units to produce a high (10,000-30,000) molecular weight polymer.

Although the dianhydride BTDA was used for this specific example polymerization, other dianhydrides that may be employed according to the present invention include: bis(3,4-dicarboxyphenyl)ether dianhydride, bis(3,4-dicarboxyphenyl)sulfone dianhydride, bis-4-(3',4'-dicarboxyphenoxy)sulfone dianhydride, and 2,2-bis(3-4-dicarboxyphenyl)hexafluoropropane dianhydride. Pyromellitic dianhydride (PMDA) was found inappropriate for the present invention since aluminum ion-containing polymer made with PMDA was brittle and showed poor adhesive properties at both ambient and high temperatures.

Although diamine 3,3'-DABP was used in the specific example polymerization, other diamines useful in the present invention include: 3,3'-diaminodiphenylmethane, 3,3'-diaminodiphenyl sulfone, meta-phenylene diamine, 3,4'-diaminodiphenylmethane, 3,4'-diaminodiphenyl sulfone, and 3,4'-diaminobenzophenone.

Ultimate success of the metal ion-containing polyimide of the present invention as a high temperature adhesive is dependent upon the presence of the particular complex Al(acac)$_3$-tris(acetylacetonato)aluminum (III). Although the concentration of metal ion was held at a concentration of 2-3 percent by weight for this reaction, varying amounts could conceivably be used. The following variations in the anion or cation of the metal complex were found inappropriate for the polymerization of the present invention: AlCl$_3$·6H$_2$O, Fe(acac)$_3$, Cr(acac)$_3$, Ni(acac)$_2$, Mn(acac)$_3$, and Co(acac)$_3$. Failure using these variations occured because of one or more of the following: (1) metal complex did not dissolve in solvent, (2) gel formation or cross-linking of the polymer occurred upon interaction with the metal, (3) polyamic acid precipitated upon addition of the metal complex, or (4) metal promoted thermal oxidative degradation of the polymer adhesive on curing.

The solvents useful for the present invention process are of the aliphatic acyclic and cyclic ether types, such as tetrahydrofuran, m- and p-dioxane, 1,2-dimethoxyethane or monoglyme, bis(2-methoxyethyl)ether or diglyme, 1,2-bis(2-methoxyethoxy)ethane or triglyme, and bis[2-(2-methoxyethoxy)ethyl]ether or tetraglyme. These solvents have a high affinity for the polar chemical groups of the aromatic polyamic-acid intermediates, in contrast to the aromatic water-imiscible solvents such as anisole and diphenyl ether. A solvent mixture may be used in the polymerization as long as one of the solvents present in from the above family of water- or alcohol-miscible ethers. A 1:1 mixture of the ether solvent to an amide type solvent such as N,N-dimethylacetamide (DMAc), N,N-dimethylformamide (DMF), or N-methyl-2-pyrrolidone (NMP) also proved successful in the present invention.

The aluminium ion-containing polyamic acid solutions so obtained are applied to a suitably prepared substrate surface as the neat resin with or without supports such as glass fabric. Substrates that may be bonded using the adhesives of the present invention include metals, such as titanium, steel, aluminum, and the like; composite materials such as graphite/polyimide, graphite/epoxy, glass/polyimide, glass/epoxy, and the like, as well as polymeric films either metallized or unmetallized. The adhesive-coated substrates are allowed to stand to allow most of the solvent to evaporate, or may be prestaged to a certain temperature to remove solvent. Substrates are then bonded together using heat (250°-300° C.) and, if necessary, pressure (50-200 psi). The applied heat completes solvent evaporation and converts the intermediate Al/polyamic acid to the thermally resistant cyclic polyimide containing aluminum ions. During this process, an excellent adhesive bond is formed. Times varying from 20 seconds to one hour or more at temperature and pressure (when necessary), serve to cure the bonded joint. Minor adjustments in the process make it well suited for autoclaving or vacuum bag operations.

During the cure, the Al(acac)$_3$ which has been reacted with BTDA-3,3'-DABP, prepared from an ether solvent maintains integrity as a metal complex rather than converting to the free metal. Proof of this behavior is based on X-ray photoelectron spectroscopic data. A binding energy of 118.4 eV for Al $2s_{\frac{1}{2}}$ is determined based on an internal carbon calibration of C $1s_{\frac{1}{2}}$ assumed to be 284.0 eV. This value of 118.4 eV coupled with the facts that (1) no change in binding energy is found for oxygen or nitrogen in the polyimide and (2) the binding energy of Al $2s_{\frac{1}{2}}$ in AL(acac)$_3$ is 118.5 eV (as opposed to 115.8 eV for the free metal) indicates that aluminum continues to be bound to acetylacetonate in the polyimide. This behavior is believed to be the reason that the adhesive is able to maintain excellent strengths at high temperature. Other polyamic acid systems containing metal acetylacetonates not cited in this process are converted on curing to the polyimide plus the free metal, which renders them essentially useless as high temperature adhesives.

SPECIFIC EXAMPLE

Preparation of the adhesive resin BTDA-3,3'-DABP-/Al(acac)$_3$ was conducted at room temperature. To a solution of 7.07 g (0.033 mole) of 3,3'-diaminobenzophenone(3,3'-DABP) in 80 ml of 1:1 diglyme/DMAc was added 10.7 g (0.033 mole) of 3,3', 4,4'-benzophenone tetracarboxylic acid dianhydride, resulting in a 20 percent solids polyamic acid solution. Tris-(acetylacetonato)aluminum (III) (0.44 g) in a small amount of solvent was added to the above mixture so that the final solution concentration was 15 percent solids. The aluminum ion-containing polyamic acid solution was clear yellow and viscous. The inherent viscosity of the solution measured at 0.5 percent solids in DMAc at 35° C. was 0.7 dl/g.

In preparation for bonding, one inch-wide, 6-aluminum 4-vanadium titanium alloy panels which had been cleaned with standard Pasa-Jel were brush-coated with the Al/polyamic acid adhesive, so as to give an overlap of ½ inch. A total of 8-10 coats of adhesive was applied to the titanium adherends and the panels were dried at 60° C. in a forced air oven between coats. E-glass cloth with an A-1100 finish was added across the bondline along with the last coat to support the adhesive. After the final coat, the panels were staged one hour at 100° C., and ½ hour at 175° C.

The lap-shear panels containing adhesive/glass cloth were then overlapped ½ inch with panels containing adhesive only and were assembled in a bonding jig in such a manner as to hold the specimens securely while being bonded. The assembly was placed in a hydraulic press where it was heated under 50 psi pressure at 5° C./min. to 325° C. The temperature, which was monitored by a thermocouple spotwelded next to the bondline, was maintained for one hour. The assembly was then allowed to cool under pressure to less than 100° C. before opening. The bonded panel was removed from the press and bonding jig, individual specimens were separated with a metal cutter, and the lap shear strengths were determined.

The following table presents physical properties and the results of lap shear tests performed on BTDA+3,3'-DABP/Al(acac)$_3$ and provides a comparison with similar data obtained on the polymer alone containing no aluminum ion complex.

TABLE

Properties of BTDA + 3,3'-DABP

| Polymer | Tg (°C.)[a] | PDT (°C.)[b] | Lap Shear Strength (psi)[c] | | | |
|---|---|---|---|---|---|---|
| | | | RT | 250° C. | 275° C. | 300° C. |
| With Al(acac) | 271 | 555 | 2380 | 1890 | 1640 | 700 |
| Polymer alone | 251 | 570 | 2970 | 1570 | 0 | 0 |

[a]Glass transition temperature determined by thermo-mechanical analysis at 5° C./min in static air.
[b]Polymer Decomposition Temperature determined by thermogravimetric analysis at 2° C./min in air.
[c]Lap shear tensile strength on titanium alloy determined according to ASTM D-1002 (CTM No. 26).

The above results indicate the superior bond strengths at high temperature caused by the addition of the Al(acac)$_3$ to the BTDA+3,3'-DABP polymer. The addition of Al(acac)$_3$ to the polymer is also an improvement over the prior art method of loading the polymer with heavy metal powder to produce better adhesive results at high temperatures. As opposed to the metal powder filled polymer, the aluminum ion-containing BTDA+3,3'-DABP polymer is able to maintain the flexibility of a linear system without embrittlement caused by a free metal filler. This property makes the BTDA+3,3'-DABP/Al(acac)$_3$ adhesive an excellent candidate for bonding thin film where flexibility of the bondline is of necessity. In addition, the Al(acac)$_3$ polymer at a loading of 2.5 percent (weight of metal to polymer) provides a considerable weight-savings over the polymer loaded with 80 percent aluminum powder in order to achieve similar adhesive properties. This feature makes the Al(acac)$_3$ adhesive ideal for bonding lightweight structural composites and/or films for future aircraft or spacecraft without adding excessive weight.

What is claimed as new and desired to be secured by Letters Patent of the United States is:

1. A method for preparing an aluminun ion-containing polyimide adhesive solution which comprises:
   reacting an aromatic dianhydride with an equimolar quantity of a meta-oriented aromatic diamine followed by the addition of 2–3 percent by weight of an aluminum ion-containing metal complex;
   the dianhydride and diamine reactants being previously dissolved in a solvent or mixture of solvents, at least one of which is selected from the group consisting of,
   1,2-dimethoxyethane,
   bis(2-methoxyethyl)-ether,
   1,2-bis(2-methoxyethoxy)ethane, and
   bis-[2-(2-methoxyethoxy)-ethyl]ether.

2. The method of claim 1 wherein the diamine is selected from the group of meta-containing diamines consisting of:
   3,3'-diaminobenzophenone,
   3,3'-diaminodiphyenylmethane,
   3,3'-diaminodiphenyl sulfone,
   meta-phenylene diamine,
   3,4'-diaminodiphenylmethane,
   3,4'-diaminodiphenyl sulfone, and
   3-4'-diaminobenzophenone.

3. The method of claim 1 wherein the dianhydride is selected from the group of dianhydrides consisting of:
   3,3',4,4'-benzophenone tetracarboxylic acid dianhydride,
   bis(3,4-dicarboxyphenyl)ether dianhydride,
   bis(3,4-dicarboxyphenyl)sulfone dianhydride,
   bis-4-(3',4'-dicarboxyphenoxy)diphenyl sulfone dianhydride, and
   2,2-bis(3,4-dicarboxyphenyl)hexafluoropropane dianhydride.

4. The method of claim 1 wherein the initial reactant product is an aluminum ion-containing aromatic polyamic acid which has recurring units of the formula:

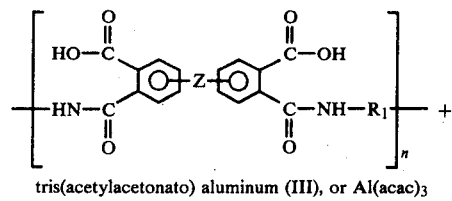

tris(acetylacetonato) aluminum (III), or Al(acac)$_3$ where Z is selected from the group consisting

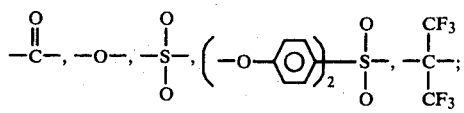

R$_1$ is selected from

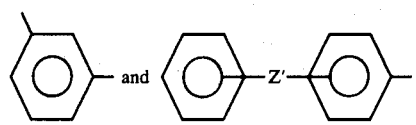

and, wherein Z' is selected from the group consisting of

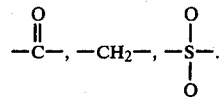

5. The method of claim 1 wherein the metal complex is tris(acetylacetonato)aluminum (III) or Al(acac)$_3$.

6. The method of claim 5 including the further steps of applying the aluminum ion-containing adhesive solution to substrate surfaces, allowing some or all of the solvent to evaporate, assembling together the treated substrate surfaces and heating the Al/polyamic acid in the temperature range of 250°–350° C. for at least one hour to complete evaporation of the solvent and to convert the Al/polyamic acid to a thermally resistant cyclic aluminum ion-containing polyimide having the recurring units of the formula:

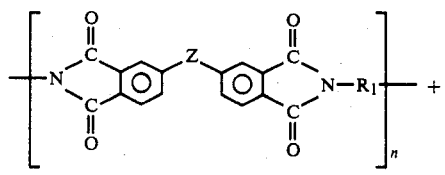

tris(acetylacetonato) aluminum (III), or Al(acac)$_3$ where Z is selected from the group consisting $R_1$ is selected from
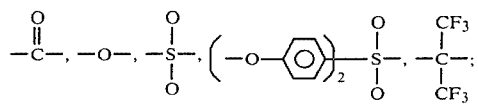
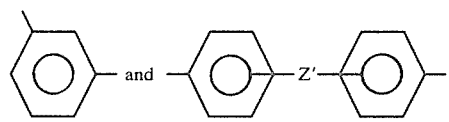
and, where Z' is selected from the group consisting of
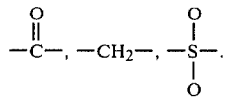
* * * * *